US009281846B2

(12) United States Patent
Derby et al.

(10) Patent No.: US 9,281,846 B2
(45) Date of Patent: Mar. 8, 2016

(54) TURBO ENCODING ON A PARALLEL PROCESSOR

(71) Applicant: International Business Machines Corporation, Armonk, NY (US)

(72) Inventors: Jeffrey Haskell Derby, Chapel Hill, NC (US); Dheeraj Sreedhar, Bangalore (IN)

(73) Assignee: GLOBALFOUNDRIES INC, Grand Cayman (KY)

( * ) Notice: Subject to any disclaimer, the term of this patent is extended or adjusted under 35 U.S.C. 154(b) by 275 days.

(21) Appl. No.: 13/955,513

(22) Filed: Jul. 31, 2013

(65) Prior Publication Data

US 2015/0039961 A1 Feb. 5, 2015

(51) Int. Cl.
*H03M 13/29* (2006.01)
*H03M 13/00* (2006.01)
*H03M 13/11* (2006.01)

(52) U.S. Cl.
CPC ........ *H03M 13/2957* (2013.01); *H03M 13/296* (2013.01); *H03M 13/611* (2013.01); *H03M 13/6561* (2013.01); *H03M 13/114* (2013.01); *H03M 13/1137* (2013.01); *H03M 13/2963* (2013.01)

(58) Field of Classification Search
CPC ..................... H03M 13/1131; H03M 13/1134; H03M 13/1137; H03M 13/114; H03M 13/29; H03M 13/2957; H03M 13/296; H03M 13/2969; H03M 13/2972; H03M 13/611; H03M 13/6561
USPC .......................................... 714/746, 752, 755
See application file for complete search history.

(56) References Cited

U.S. PATENT DOCUMENTS

| | | | |
|---|---|---|---|
| 6,560,362 B1 * | 5/2003 | Piret et al. ..................... | 382/232 |
| 6,651,209 B1 | 11/2003 | Morsberger et al. | |
| 7,478,312 B2 | 1/2009 | Nagase et al. | |
| 7,873,893 B2 | 1/2011 | Nimbalker et al. | |
| 2003/0123563 A1 | 7/2003 | Lu | |
| 2008/0077769 A1 | 3/2008 | Mimar | |
| 2011/0138259 A1 | 6/2011 | Tan et al. | |
| 2011/0153758 A1 * | 6/2011 | Akama et al. .................. | 709/206 |
| 2011/0314073 A1 | 12/2011 | Yu | |
| 2012/0324316 A1 * | 12/2012 | Kalfon et al. .................. | 714/786 |
| 2013/0262775 A1 * | 10/2013 | Asaro et al. .................... | 711/135 |

OTHER PUBLICATIONS

Purwita, Ardimas Andi et al., "Optimized 8-Level Turbo Encoder Algorithm and VLSI Architecture for LTE," 2011 International Conference on Electrical Engineering and Informatics, Bandung, Indonesia, Jul. 17-19, 2011, 6 pages, IEEE Digital Library.

(Continued)

*Primary Examiner* — Albert Decady
*Assistant Examiner* — Christian Dorman
(74) *Attorney, Agent, or Firm* — Ference & Associates LLC (57) ABSTRACT

Methods and arrangements for parallelizing turbo encoding computations. At least one processor is provided. Turbo encoding computations are split into first and second parts. Using at least one processor, the computations of the first part are performed. Thereafter, using the at least one processor, the computations of the second part are performed, the second part correcting output provided by the computations of the first part. One of the first and second parts comprises computations performed in parallel and the other of the first and second parts comprises computations performed not in parallel. Other variants and embodiments are broadly contemplated herein.

14 Claims, 8 Drawing Sheets

(56) References Cited

OTHER PUBLICATIONS

Sabir, M. Farooq et al., "A Real-Time Embedded Software Implementation of a Turbo Encoder and Soft Output Viterbi Algorithm Based Turbo Decoder," Conference Record of the Thirty-Sixth Asilomar Conference on Signals, Systems, and Computers, Nov. 3-6, 2002, pp. 1099-1103, IEEE Digital Library.

Vega, Augusto et al. "Architectural Perspectives of Future Wireless Base Stations based on the IBM PowerEN(TM) Processor," 2011, 10 pages, IEEE Digital Library.

Zhu, Zhenbo et al., "Virtual Base Station Pool: Towards a Wireless Network Cloud for Radio Access Networks," CF'10, Bertinoro, Italy, May 17-19, 2010, 10 pages, ACM Digital Library.

* cited by examiner

TURBO ENCODING ON A PARALLEL PROCESSOR

BACKGROUND

Generally, current implementations of wireless base stations use a combination of hardware accelerators, DSP (digital signal processor) and GPP (general purpose processor) cores. Turbo codes tend to be part of all current wireless standards, including LTE (Long Term Evolution), LTE-Advanced, HSPA (High Speed Packet Access) and WiMAX (Worldwide Interoperability for Microwave Access). Efficient implementation of turbo encoding and decoding is a challenge for software based implementations.

SIMD (single instruction, multiple data) processors typically exploit the parallelism inherent in the computations to accelerate processing. However, turbo-encoding is considered a difficult problem to implement in parallel due to the tight recursive nature inherent in computation.

BRIEF SUMMARY

In summary, one aspect of the invention provides a method of parallelizing turbo encoding computations, said method comprising: splitting turbo encoding computations into first and second parts; performing, using at least one processor, the computations of the first part; and thereafter performing, using the at least one processor, the computations of the second part, the second part correcting output provided by the computations of the first part; wherein one of the first and second parts comprises computations performed in parallel and the other of the first and second parts comprises computations performed not in parallel.

Another aspect of the invention provides an apparatus for parallelizing turbo encoding computations, said apparatus comprising: at least one processor; and a computer readable storage medium having computer readable program code embodied therewith and executable by the at least one processor, the computer readable program code comprising: computer readable program code configured to split turbo encoding computations into first and second parts; computer readable program code configured to performing, using the least one processor, the computations of the first part; and computer readable program code configured to perform thereafter, using the at least one processor, the computations of the second part, the second part correcting output provided by the computations of the first part; wherein one of the first and second parts comprises computations performed in parallel and the other of the first and second parts comprises computations performed not in parallel.

An additional aspect of the invention provides a computer program product for parallelizing turbo encoding computations, said computer program product comprising: a computer readable storage medium having computer readable program code embodied therewith, the computer readable program code comprising: computer readable program code configured to split turbo encoding computations into first and second parts; computer readable program code configured to performing, using at least one processor, the computations of the first part; and computer readable program code configured to perform thereafter, using the at least one processor, the computations of the second part, the second part correcting output provided by the computations of the first part; wherein one of the first and second parts comprises computations performed in parallel and the other of the first and second parts comprises computations performed not in parallel.

An additional aspect of the invention provides a method comprising: implementing turbo encoding computations on a SIMD processor in communication with a wireless base station, the computations being split into first and second parts; and performing the first and second parts respectively in sequence; the first part comprising computations performed in parallel and the second part comprising computations performed serially; and the computations of the second part correcting output provided by computations of the first part.

For a better understanding of exemplary embodiments of the invention, together with other and further features and advantages thereof, reference is made to the following description, taken in conjunction with the accompanying drawings, and the scope of the claimed embodiments of the invention will be pointed out in the appended claims.

DETAILED DESCRIPTION

It will be readily understood that the components of the embodiments of the invention, as generally described and illustrated in the figures herein, may be arranged and designed in a wide variety of different configurations in addition to the described exemplary embodiments. Thus, the following more detailed description of the embodiments of the invention, as represented in the figures, is not intended to limit the scope of the embodiments of the invention, as claimed, but is merely representative of exemplary embodiments of the invention.

Reference throughout this specification to "one embodiment" or "an embodiment" (or the like) means that a particular feature, structure, or characteristic described in connection with the embodiment is included in at least one embodiment of the invention. Thus, appearances of the phrases "in one embodiment" or "in an embodiment" or the like in various places throughout this specification are not necessarily all referring to the same embodiment.

Furthermore, the described features, structures, or characteristics may be combined in any suitable manner in at least one embodiment. In the following description, numerous specific details are provided to give a thorough understanding of embodiments of the invention. One skilled in the relevant art may well recognize, however, that embodiments of the invention can be practiced without at least one of the specific details thereof, or can be practiced with other methods, components, materials, et cetera. In other instances, well-known structures, materials, or operations are not shown or described in detail to avoid obscuring aspects of the invention.

The description now turns to the figures. The illustrated embodiments of the invention will be best understood by reference to the figures. The following description is intended only by way of example and simply illustrates certain selected exemplary embodiments of the invention as claimed herein.

It should be noted that the flowchart and block diagrams in the figures illustrate the architecture, functionality, and operation of possible implementations of systems, apparatuses, methods and computer program products according to various embodiments of the invention. In this regard, each block in the flowchart or block diagrams may represent a module, segment, or portion of code, which comprises at least one executable instruction for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Specific reference will now be made herebelow to FIGS. 1-7. It should be appreciated that the processes, arrangements and products broadly illustrated therein can be carried out on, or in accordance with, essentially any suitable computer system or set of computer systems, which may, by way of an illustrative and non-restrictive example, include a system or server such as that indicated at 12' in FIG. 8. In accordance with an example embodiment, most if not all of the process steps, components and outputs discussed with respect to FIGS. 1-7 can be performed or utilized by way of a processing unit or units and system memory such as those indicated, respectively, at 16' and 28' in FIG. 8, whether on a server computer, a client computer, a node computer in a distributed network, or any combination thereof.

By way of general background, wireless network infrastructures (e.g., base stations, gateways) and telecom IT infrastructures, like data centers, billing servers, service delivery platform middlewares, have traditionally not intersected. However, in other networking contexts, IT platforms have recently been considered to replace custom platforms that are based on FPGAs (field programmable gate arrays), DSPs (digital signal processors), etc. For instance, soft-switches in telephony and control-plane processing in data networking (e.g., routing and signaling) have been consolidated in blade server computational platforms, while data-plane packet processing is performed on network processors. Similar trends are emerging in 4G wireless, where the control plane elements like the Mobility Management Entity (MME), Policy and Charging Rules Function (PCRF), etc., will be supported on general purpose servers, traditionally used for IT applications.

Software radio offers the opportunity for the MAC (media access control) and PHY (physical) layers in wireless network stacks to be consolidated on multi-core servers that offer rich programming environments and a large community of developers. Specifically, large-volume, low-unit cost hybrid IT systems will offer multi-cores, massive multi-threading, sufficient I/O throughput and accelerators for signal processing to meet the requirements of such mixed-mode workloads. These key capabilities and accelerators may well end up becoming integrated a single System-on-Chip (SoC) processor. Equally important, with IT systems increasingly providing capabilities for virtualization, concepts such as virtual base stations can be realized while allowing the support of multiple virtual operators on common infrastructures with robust isolation support. However, realizing software radio on these platforms involves shifts in programming styles: using massive parallelism while ensuring real-time performance, tackling issues of OS and non-OS jitter, and leveraging accelerators.

Though backhaul from base stations to the core is expected to remain a constraint in several geographies, a long-term solution to backhaul capacity demand has involved laying fiber or providing metro-ethernet capacity to towers. The combination of fiber-to-towers and virtualization via software radio allows a more radical deployment approach: physically unbundle the base stations into virtual base stations (VBS) implemented on IT platforms, pooling them at local "cloud" sites and connect them to shared Remote Radio Heads (RRH) attached to the towers.

Figure 1:
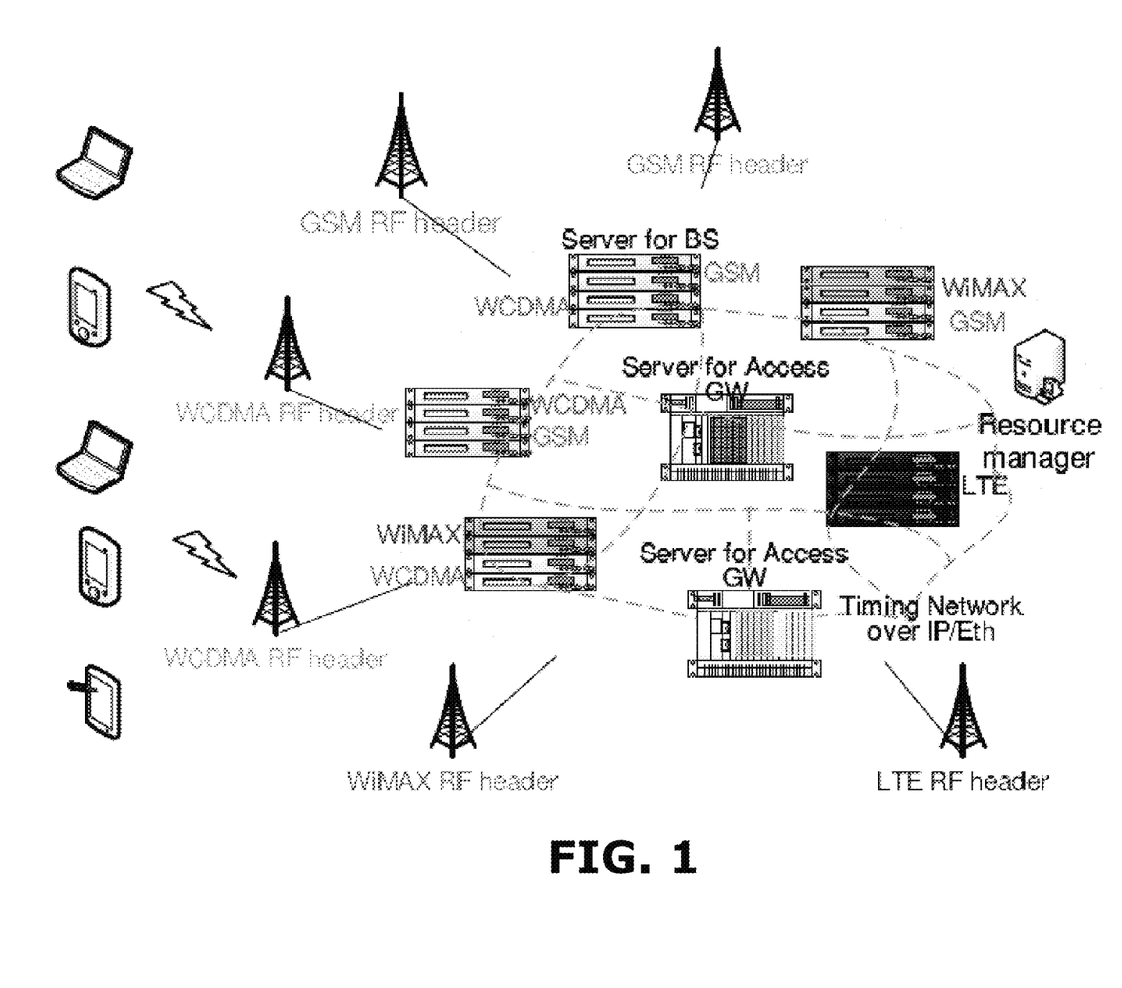
FIG. 1 provides a schematic illustration of a wireless network cloud.

This network architecture for next-generation wireless access networks, called the wireless network cloud (WNC), is illustrated, by way of a non-restrictive example, in FIG. 1. Generally, WNC supports (a) multiple wireless standards over a low cost platform, (b) mobile virtual network operator (MVNO) network-sharing models, and (c) integration of both the service plane along with the wireless data- and control-planes for workload balancing in different districts. Ultimately, this increases system resource utilization and decreases capital investment requirements.

Figure 2:
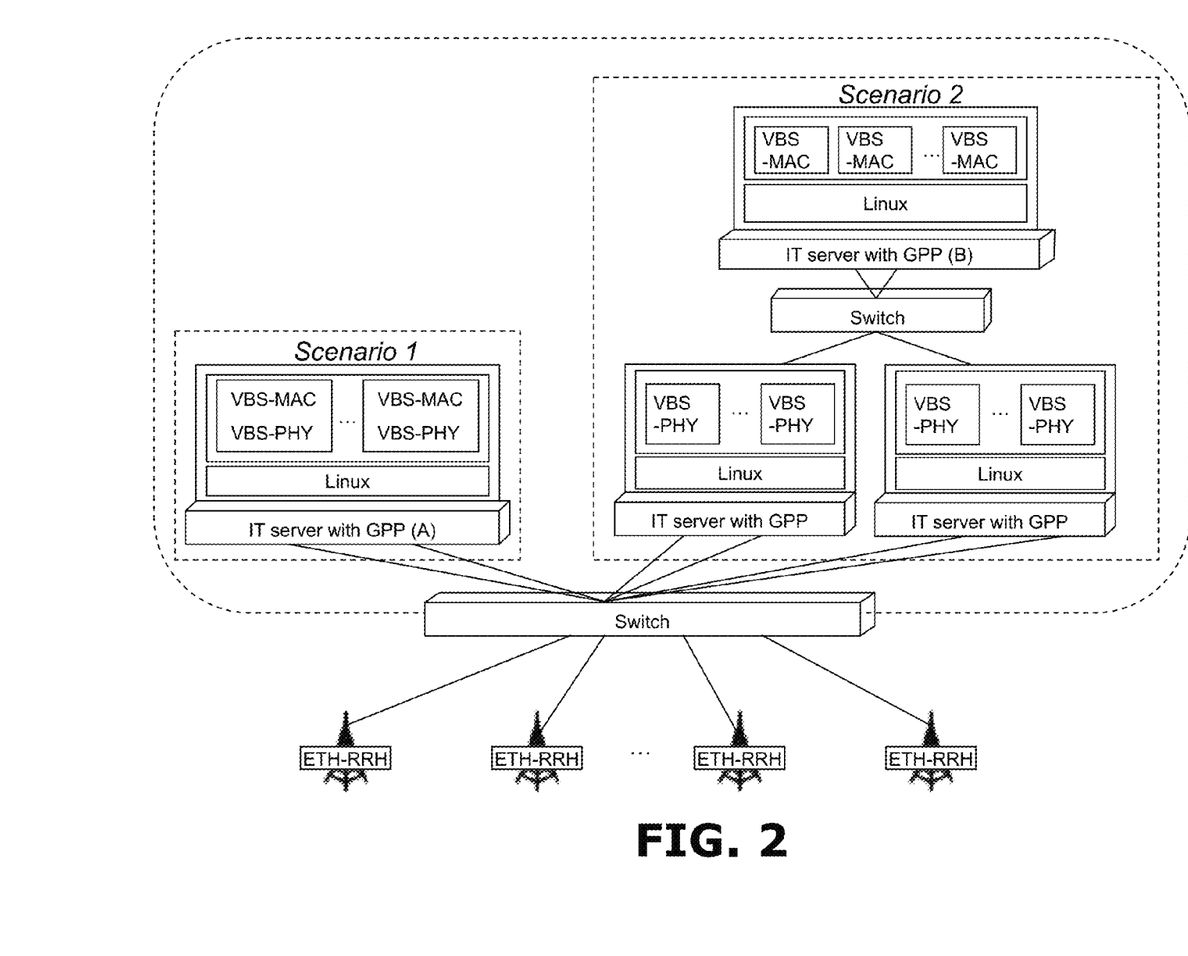
FIG. 2 provides a schematic illustration of a virtual base station pool.

By way of an illustrative and non-restrictive example, FIG. 2 shows the structure of a virtual base station pool. It includes three main parts: remote radio head (RRH), the physical processing nodes and networks, and virtual base station (VBS) instances.

The disclosure now turns to a discussion of turbo encoding in accordance with embodiments of the invention, and which may be undertaken in a wireless base station or other environment, such as in a virtual base station environment as discussed hereabove. While wireless base stations, such as in a virtual base station environment, are discussed herein by way of an illustrative example for providing an environment for turbo encoding according to at least one embodiment of the invention, it should be understood and appreciated that other implementations are possible such as in a user device (e.g., a tablet computer or a mobile phone such as a smart phone), for DSL (digital subscriber line) service and/or for other communication facilities that may employ turbo encoding.

Figure 3:
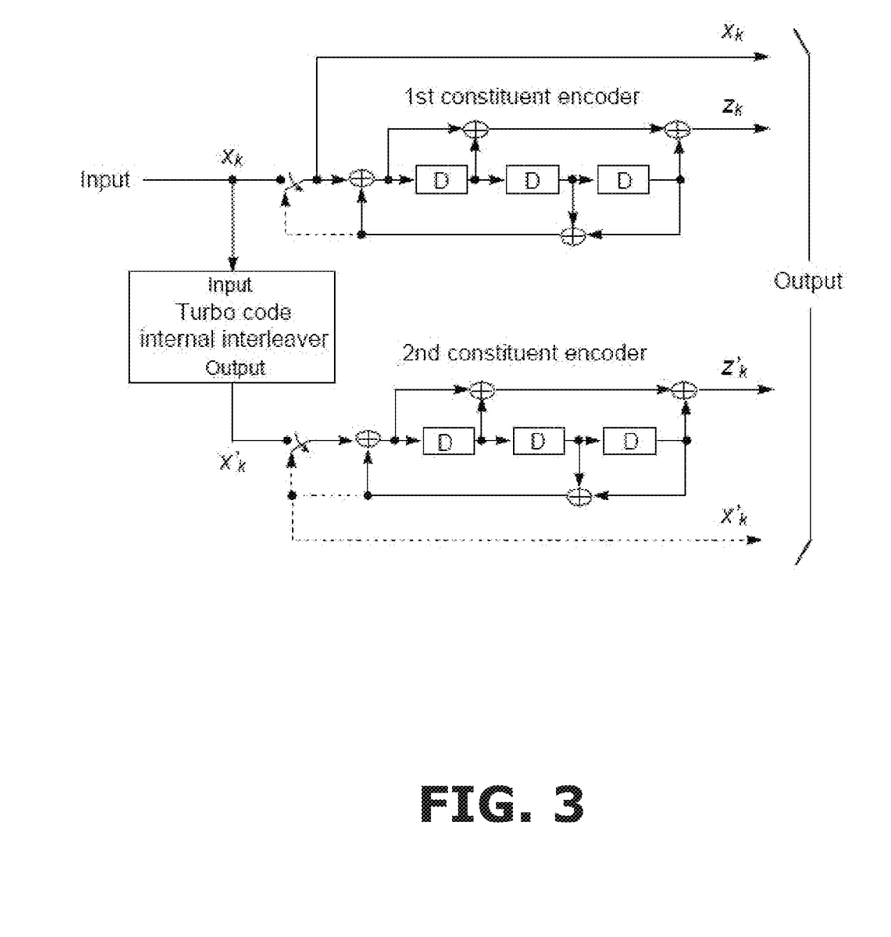
FIG. 3 schematically illustrates a conventional manner of turbo encoding.

FIG. 3 schematically illustrates a manner of conventional turbo encoding. It can be appreciated that the need for recursivity adds an undesirable degree of complexity to the design. Particularly, recursivity comes about because the output of a series of components are fed back into the input, thereby making the processing as a whole actually serial in nature. As such, the computations involved in turbo encoding do not easily lend themselves to parallel implementation.

In accordance with at least one embodiment of the invention, there is broadly contemplated a method to efficiently parallelize the computations involved in turbo encoding. This parallelization can be readily implemented on a SIMD processor.

In accordance with at least one embodiment of the invention, computations are split into two parts, one of which is done in parallel and the second part, serially. The serial part of the computations serves to correct any incorrect computations that may have arisen from parallelization. It can thereby be shown that, with a correct choice of processing block size, it is possible to obtain acceleration computation 4.5 times faster as compared to a serial implementation for a SIMD width of 256 bits.

In accordance with at least one embodiment of the invention, there is also provided a method for implementing the processing discussed above on a SIMD processor. Though a SIMD processor implementation is focused on herein by way of an illustrative working example, the parallelization method described can be easily applied on an ASIC as well as on multi-core based implementations.

Figure 4:
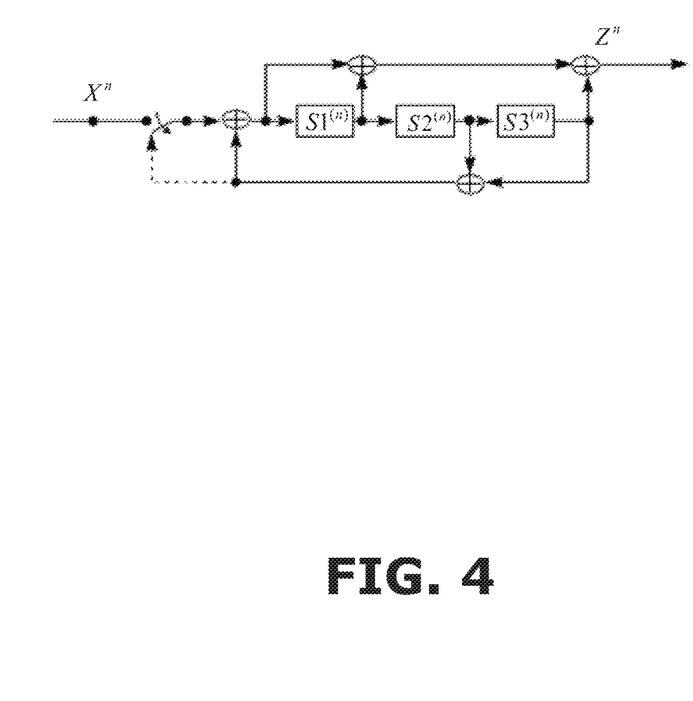
FIG. 4 schematically illustrates a first constituent turbo encoder.

FIG. 4 schematically illustrates a first constituent encoder. A formulation is thus provided below based on the illustrated code, though it should be understood that merely an illustrative and non-restrictive example is shown. It should be understood that each constituent encoder is a finite state machine with three state variables (referred to herein as S1, S2 and S3) and that these can be viewed as elements of a state vector S. An output block of N bits can then be written on the basis of this formulation, where:

$$S^{(n)} = \begin{bmatrix} S1^{(n)} \\ S2^{(n)} \\ S3^{(n)} \end{bmatrix} = \begin{bmatrix} 0 & 1 & 1 & 1 \\ 1 & 0 & 0 & 0 \\ 0 & 1 & 0 & 0 \end{bmatrix} \begin{bmatrix} S1^{(n-1)} \\ S2^{(n-1)} \\ S3^{(n-1)} \\ X^n \end{bmatrix} = A \begin{bmatrix} S^{(n-1)} \\ X^n \end{bmatrix}, \text{ and}$$

$$Z^n = \begin{bmatrix} 1 & 1 & 1 & 1 \end{bmatrix} \begin{bmatrix} S1^{(n)} \\ S2^{(n)} \\ S3^{(n)} \\ X^n \end{bmatrix} =$$

$$\begin{bmatrix} \sum A_{1,j} & \sum A_{2,i} & \sum A_{3,i} & 1 & 1 \end{bmatrix} \begin{bmatrix} S1^{(n-1)} \\ S2^{(n-1)} \\ S3^{(n-1)} \\ X^{n-1} \\ \vdots \\ X^n \end{bmatrix} = [1 \times (n+3)\text{row}] \begin{bmatrix} S1^{(0)} \\ S2^{(0)} \\ S3^{(0)} \\ X^1 \\ \vdots \\ X^n \end{bmatrix}$$

where: $S1^{(n)}, S2^{(n)}, S3^{(n)}$ is the state after processing n bits. $X^n$ is the n'th input bit and $Z^n$ is the n'th output bit. $A_{i,j}$ are fixed matrices that could be derived from A Continuing with the present illustrative example, in accordance with at least one embodiment of the invention, if there is chosen N=253, then 253 bits of output can be generated using 256 vector operations. Inasmuch as this is a completely serial implementation, there is no parallelism and SIMD lanes cannot be used effectively. The formulation thus can be rewritten in terms of vector XOR operations with fixed vectors as follows:

$$\begin{bmatrix} Z^N \\ Z^{N-1} \\ \vdots \\ Z^1 \end{bmatrix} = [(N+3) \times (N+3)\text{matrix}]$$

$$\begin{bmatrix} S1^{(0)} \\ S2^{(0)} \\ S3^{(0)} \\ X^1 \\ \vdots \\ X^n \end{bmatrix} = \begin{bmatrix} \vdots \\ S1^{(0)} \\ \vdots \end{bmatrix} \otimes \begin{bmatrix} \vdots \\ S2^{(0)} \\ \vdots \end{bmatrix} \otimes \cdots \otimes \begin{bmatrix} \vdots \\ \vdots \end{bmatrix} X^N$$

In accordance with at least one embodiment of the invention, the output vector is reformulated to also include state information as output such that:

$$\begin{bmatrix} S1^{(N)} \\ S2^{(N)} \\ S3^{(N)} \\ Z^1 \\ \vdots \\ Z^N \end{bmatrix} = \underbrace{[(N+3) \times (N+3)\text{matrix}]}_{G} \left( \begin{bmatrix} 0 \\ 0 \\ 0 \\ X^1 \\ \vdots \\ X^n \\ \underbrace{}_{X^{1:N}} \end{bmatrix} + \begin{bmatrix} S1^{(0)} \\ S2^{(0)} \\ S3^{(0)} \\ 0 \\ \vdots \\ 0 \\ \underbrace{}_{\overline{S}^{(0)}} \end{bmatrix} \right) = G\overline{X}^{1:N} + G\overline{S}^{(0)}$$

In accordance with at least one embodiment of the invention, with the above formulation, it is possible to work in parallel over blocks of "N" bits. Particularly, inasmuch as G is a fixed matrix (that can be derived from A), with K blocks of "N" bits, there can be computed in parallel: $G\overline{X}^{1:N}$, $G\overline{X}^{N+1:2N}, \ldots, G\overline{X}^{(K-1)N+1:KN}$. This can be undertaken in N vector instructions given that each block is processed in one SIMD lane.

As such, in accordance with at least one embodiment of the invention, it can be noted that that the state vector is the only connection between the two consecutive blocks of N bits. Given that a "0" initial state is started with, after the parallel operations, output will be correct only for the first block. Thus, for all the blocks starting from the second one, a correction is made to the output based on the correct initial state, and this is done serially. Since there are only 3 state bits, the output for each block can be corrected with just 3 vector operations.

Figure 5:
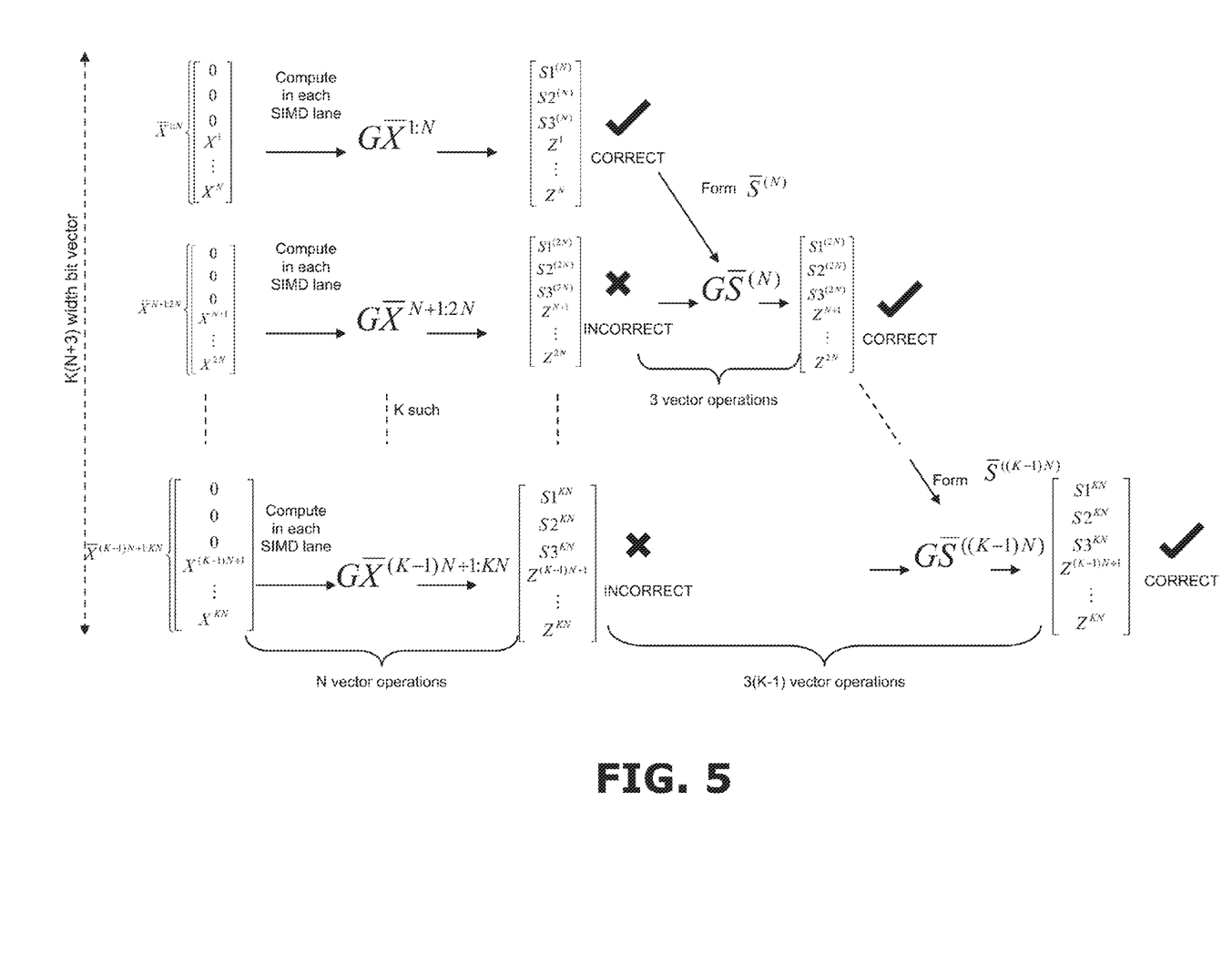
FIG. 5 illustrates an encoding process of a solution in accordance with at least one embodiment of the invention.

FIG. 5 illustrates yet additional aspects of a solution in accordance with at least one embodiment of the invention. This figure illustrates how the output of parallel operation is corrected by a series of serial operations. From this illustrative example for a 256 bit SIMD, block width=32, K=8 and N=29 (K(N+3)=256). The total number of vector operations required to complete the processing=N+3(K−1).

Figure 6:
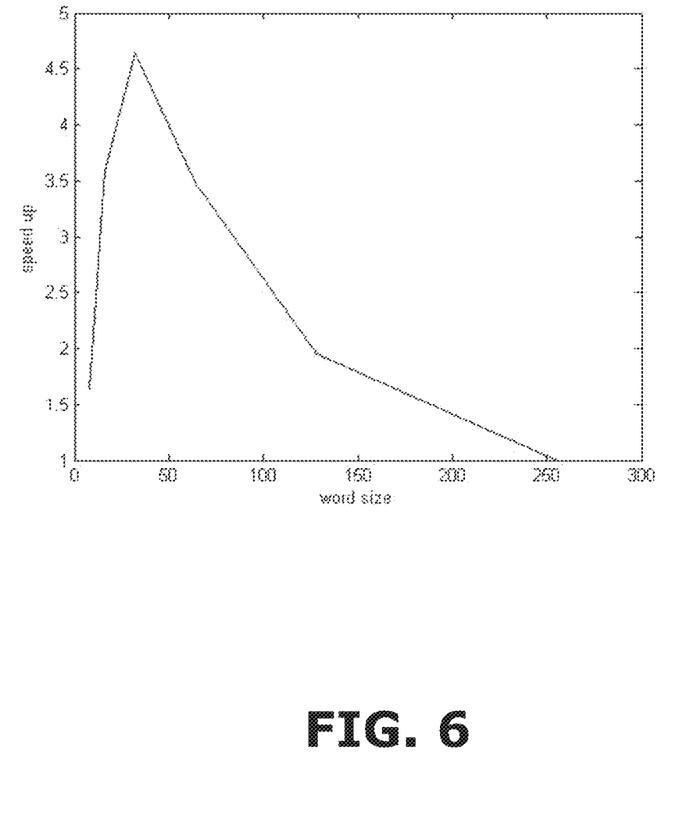
FIG. 6 graphically illustrates optimal block size in accordance with at least one embodiment of the invention.

FIG. 6 graphically illustrates optimal block size in accordance with at least one embodiment of the invention. As can be appreciated, there is a trade-off between speed-up and block size (N) for a given SIMD width W. As such, speedup can be expressed as:

Total Output bits/Total instructions=N*W/(N+3)/(N+3*((W/(N+3))−1)). Accordingly, in FIG. 6, for 256 bit SIMD (W=256), this trade-off is plotted for different block sizes (which themselves are each a power of 2). In the present, illustrative example, it can be seen that the speed-up is optimal for a block size of 32.

Figure 7:
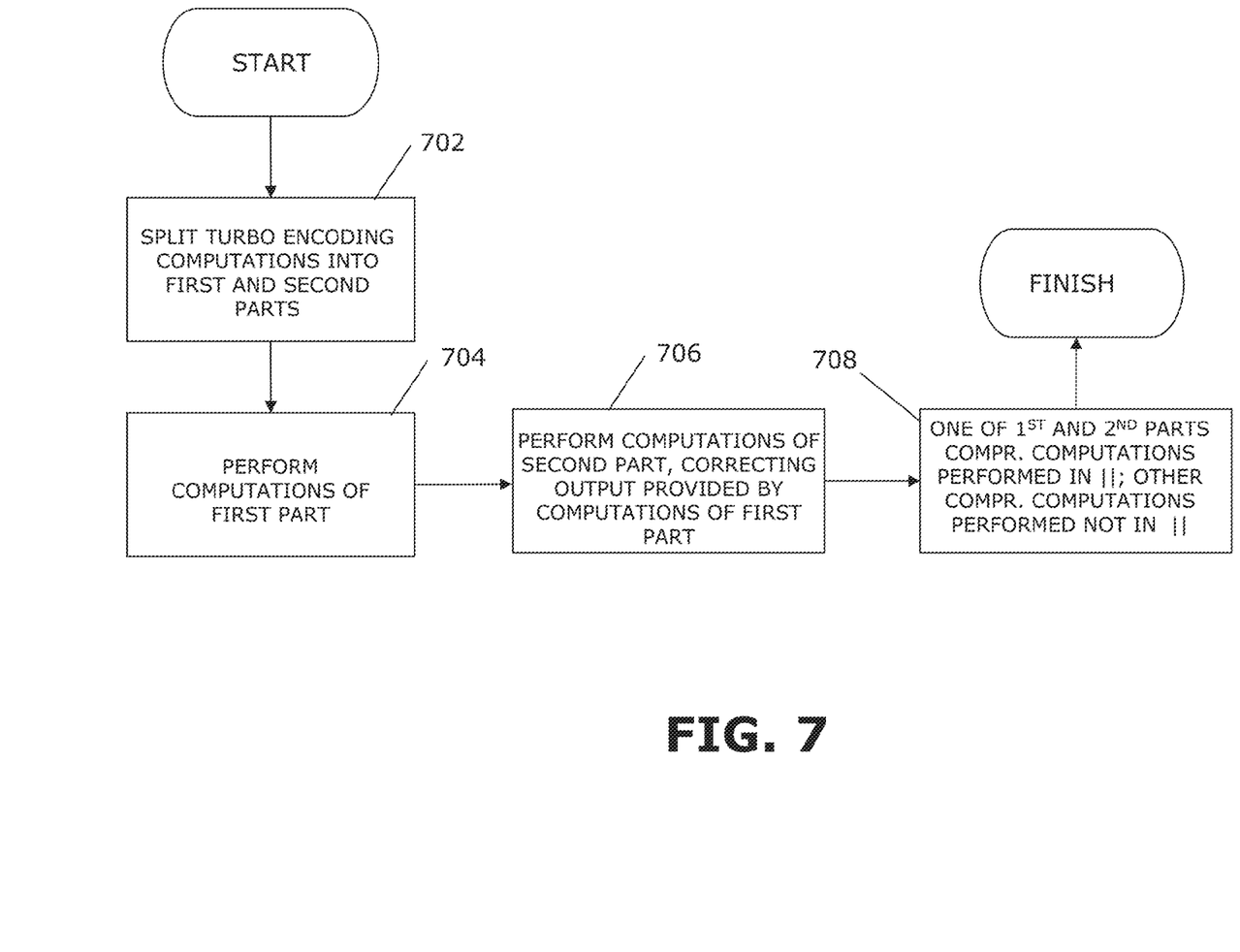
FIG. 7 sets forth a process more generally for parallelizing turbo encoding computations.

FIG. 7 sets forth a process more generally for parallelizing turbo encoding computations, in accordance with at least one embodiment of the invention. It should be appreciated that a process such as that broadly illustrated in FIG. 7 can be carried out on essentially any suitable computer system or set of computer systems, which may, by way of an illustrative and non-restrictive example, include a system such as that indicated at 12' in FIG. 8. In accordance with an example embodiment, most if not all of the process steps discussed with respect to FIG. 7 can be performed by way of a processing unit or units and system memory such as those indicated, respectively, at 16' and 28' in FIG. 8.

As shown in FIG. 7, in accordance with at least one embodiment of the invention, turbo encoding computations are split into first and second parts (702). Using at least one processor, the computations of the first part are performed (704). Thereafter, using the at least one processor, the computations of the second part are performed, the second part correcting output provided by the computations of the first part (706). One of the first and second parts comprises computations performed in parallel and the other of the first and second parts comprises computations performed not in parallel (708).

Figure 8:
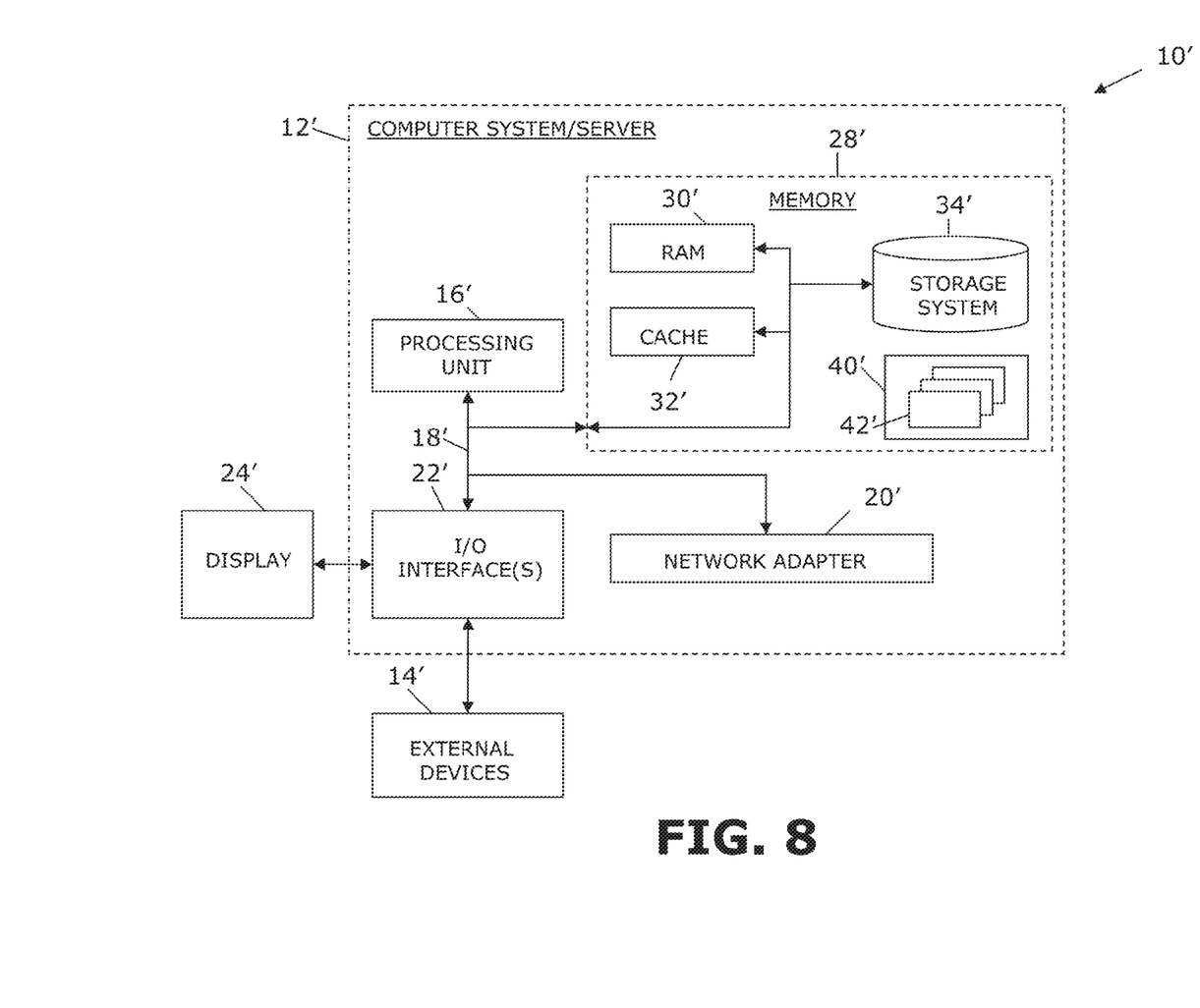
FIG. 8 illustrates a computer system.

Referring now to FIG. 8, a schematic of an example of a cloud computing node is shown which, e.g., may be employed in one or more wireless base stations in accordance with at least one embodiment of the invention. Particularly, by way of illustrative example, the node may provide support for communication channels as well as for other applications. Cloud computing node 10' is only one example of a suitable cloud computing node and is not intended to suggest any limitation as to the scope of use or functionality of embodiments of the invention described herein. Regardless, cloud computing node 10' is capable of being implemented and/or performing any of the functionality set forth hereinabove. In accordance with embodiments of the invention, computing node 10' may not necessarily even be part of a cloud network but instead could be part of another type of distributed or other network, or could represent a stand-alone node. For the purposes of discussion and illustration, however, node 10' is variously referred to herein as a "cloud computing node".

In cloud computing node 10' there is a computer system/server 12', which is operational with numerous other general purpose or special purpose computing system environments or configurations. Examples of well-known computing systems, environments, and/or configurations that may be suitable for use with computer system/server 12' include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12' may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12' may be practiced in distributed cloud computing environments where tasks are performed by remote processing devices that are linked through a communications network. In a distributed cloud computing environment, program modules may be located in both local and remote computer system storage media including memory storage devices.

As shown in FIG. 8, computer system/server 12' in cloud computing node 10 is shown in the form of a general-purpose computing device. The components of computer system/server 12' may include, but are not limited to, at least one processor or processing unit 16', a system memory 28', and a bus 18' that couples various system components including system memory 28' to processor 16'.

Bus 18' represents at least one of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12' typically includes a variety of computer system readable media. Such media may be any available media that are accessible by computer system/server 12', and include both volatile and non-volatile media, removable and non-removable media.

System memory 28' can include computer system readable media in the form of volatile memory, such as random access memory (RAM) 30' and/or cache memory 32'. Computer system/server 12' may further include other removable/non-removable, volatile/non-volatile computer system storage media. By way of example only, storage system 34' can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18' by at least one data media interface. As will be further depicted and described below, memory 28' may include at least one program product having a set (e.g., at least one) of program modules that are configured to carry out the functions of embodiments of the invention.

Program/utility 40', having a set (at least one) of program modules 42', may be stored in memory 28' (by way of example, and not limitation), as well as an operating system, at least one application program, other program modules, and program data. Each of the operating systems, at least one application program, other program modules, and program data or some combination thereof, may include an implementation of a networking environment. Program modules 42' generally carry out the functions and/or methodologies of embodiments of the invention as described herein.

Computer system/server 12' may also communicate with at least one external device 14' such as a keyboard, a pointing device, a display 24', etc.; at least one device that enables a user to interact with computer system/server 12; and/or any devices (e.g., network card, modem, etc.) that enable computer system/server 12' to communicate with at least one other computing device. Such communication can occur via I/O interfaces 22'. Still yet, computer system/server 12' can communicate with at least one network such as a local area network (LAN), a general wide area network (WAN), and/or a public network (e.g., the Internet) via network adapter 20'. As depicted, network adapter 20' communicates with the other components of computer system/server 12' via bus 18'. It should be understood that although not shown, other hardware and/or software components could be used in conjunction with computer system/server 12'. Examples include, but are not limited to: microcode, device drivers, redundant processing units, external disk drive arrays, RAID systems, tape drives, and data archival storage systems, etc.

It should be noted that aspects of the invention may be embodied as a system, method or computer program product.

Accordingly, aspects of the invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the invention may take the form of a computer program product embodied in at least one computer readable medium having computer readable program code embodied thereon.

Any combination of one or more computer readable media may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having at least one wire, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store, a program for use by, or in connection with, an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire line, optical fiber cable, RF, etc., or any suitable combination of the foregoing.

Computer program code for carrying out operations for aspects of the invention may be written in any combination of at least one programming language, including an object oriented programming language such as Java®, Smalltalk, C++ or the like and conventional procedural programming languages, such as the "C" programming language or similar programming languages. The program code may execute entirely on the user's computer (device), partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the invention are described herein with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture. Such an article of manufacture can include instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

This disclosure has been presented for purposes of illustration and description but is not intended to be exhaustive or limiting. Many modifications and variations will be apparent to those of ordinary skill in the art. The embodiments were chosen and described in order to explain principles and practical application, and to enable others of ordinary skill in the art to understand the disclosure.

Although illustrative embodiments of the invention have been described herein with reference to the accompanying drawings, it is to be understood that the embodiments of the invention are not limited to those precise embodiments, and that various other changes and modifications may be affected therein by one skilled in the art without departing from the scope or spirit of the disclosure.

What is claimed is:

1. A method of parallelizing turbo encoding computations, said method comprising:
   splitting turbo encoding computations into first and second parts;
   performing, using at least one processor, the computations of the first part; and
   thereafter performing, using the at least one processor, the computations of the second part, the second part correcting output provided by the computations of the first part;
   wherein the first part comprises computations performed in parallel and the second part comprises computations performed serially;
   producing at least one output vector from the computations of the first part; and
   reformulating the at least one output vector to include at least one state value;
   wherein the computations of the second part correct the at least one output vector based on a correct initial state.

2. The method according to claim 1, wherein the at least one processor comprises a processor in communication with a wireless base station.

3. The method according to claim 1, wherein:
   the first part comprises a first computation performed in parallel with at least one other computation of the first part, wherein the first computation produces an output that is not corrected by the second part; and the second part comprises computations performed serially to correct output of the at least one other computation of the first part.

4. The method according to claim 1, comprising:
choosing a processing block size for computations of the first part;
said choosing comprising increasing processing speed relative to computations to be performed serially by the second part.

5. The method according to claim 1, wherein the at least one processor comprises a SIMD processor.

6. The method according to claim 1, wherein the at least one processor comprises a multi-core processor.

7. The method according to claim 1, wherein the at least one processor comprises an application specific integrated circuit.

8. An apparatus for parallelizing turbo encoding computations, said apparatus comprising:
at least one processor; and
a computer readable storage medium having computer readable program code embodied therewith and executable by the at least one processor, the computer readable program code comprising:
computer readable program code configured to split turbo encoding computations into first and second parts;
computer readable program code configured to perform, using the at least one processor, the computations of the first part; and
computer readable program code configured to perform thereafter, using the at least one processor, the computations of the second part, the second part correcting output provided by the computations of the first part;
wherein the first part comprises computations performed in parallel and the second part comprises computations performed serially;
wherein said computer readable program code is further configured to:
produce at least one output vector from the computations of the first part;
reformulate the at least one output vector to include at least one state value; and
perform the computations of the second part serially, wherein the computations of the second part correct the at least one output vector based on a correct initial state.

9. A computer program product for parallelizing turbo encoding computations, said computer program product comprising:
a computer readable storage medium having computer readable program code embodied therewith, the computer readable program code comprising:
computer readable program code configured to split turbo encoding computations into first and second parts;
computer readable program code configured to perform, using at least one processor, the computations of the first part; and
computer readable program code configured to perform thereafter, using the at least one processor, the computations of the second part, the second part correcting output provided by the computations of the first part;
wherein the first part comprises computations performed in parallel and the second part comprises computations performed serially;
wherein said computer readable program code is further configured to:
produce at least one output vector from the computations of the first part;
reformulate the at least one output vector to include at least one state value; and
perform the computations of the second part serially, wherein the computations of the second part correct the at least one output vector based on a correct initial state.

10. The computer program product according to claim 9, wherein the at least one processor comprises a processor in communication with a wireless base station.

11. The computer program product according to claim 9, wherein:
the first part comprises a first computation performed in parallel with at least one other computation of the first part, wherein the first computation produces an output that is not corrected by the second part; and
the second part comprises computations performed serially to correct output of the at least one other computation of the first part.

12. The computer program product according to claim 9, wherein the at least one processor comprises a SIMD processor.

13. The computer program product according to claim 9, wherein the at least one processor comprises at least one of: a multi-core processor and an application specific integrated circuit.

14. A method comprising:
implementing turbo encoding computations on a SIMD processor in communication with a wireless base station, the computations being split into first and second parts; and
performing the first and second parts respectively in sequence;
the first part comprising computations performed in parallel and the second part comprising computations performed serially; and
the computations of the second part correcting output provided by computations of the first part; and
further comprising:
producing at least one output vector from the computations of the first part;
reformulating the at least one output vector to include at least one state value; and
performing the computations of the second part serially, wherein the computations of the second part correct the at least one output vector based on a correct initial state.

* * * * *